(12) United States Patent
Bryan et al.

(10) Patent No.: US 7,773,379 B2
(45) Date of Patent: Aug. 10, 2010

(54) MODULE ASSEMBLY HAVING HEAT TRANSFER PLATE

(75) Inventors: Lyle Stanley Bryan, Bermuda Run, NC (US); Roger Lee Thrush, Clemmons, NC (US); Robert Daniel Irlbeck, Greensboro, NC (US); Donald Robert Worthington, Pfafftown, NC (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/252,042

(22) Filed: Oct. 15, 2008

(65) Prior Publication Data

US 2009/0103268 A1  Apr. 23, 2009

Related U.S. Application Data

(60) Provisional application No. 60/999,997, filed on Oct. 23, 2007.

(51) Int. Cl.
*H05K 7/20* (2006.01)
(52) U.S. Cl. ................ 361/704; 361/690; 361/707; 361/715; 361/719

(58) Field of Classification Search .................. None
See application file for complete search history.

(56) References Cited

U.S. PATENT DOCUMENTS

| | | | | |
|---|---|---|---|---|
| 5,625,536 | A * | 4/1997 | Soyano et al. | 361/736 |
| 5,646,827 | A * | 7/1997 | Hirao et al. | 361/707 |
| 5,708,566 | A * | 1/1998 | Hunninghaus et al. | 361/704 |
| 6,301,115 | B1 * | 10/2001 | Hashimoto et al. | 361/704 |
| 6,870,738 | B2 * | 3/2005 | Goebl | 361/719 |
| 6,924,985 | B2 * | 8/2005 | Kawakita et al. | 361/715 |
| 7,006,355 | B2 * | 2/2006 | Wakabayashi et al. | 361/728 |
| 7,035,105 | B2 * | 4/2006 | Yamaguchi | 361/707 |
| 7,154,753 | B2 * | 12/2006 | Kobayashi | 361/715 |
| 7,190,589 | B2 * | 3/2007 | Caines et al. | 361/707 |
| 7,359,212 | B2 * | 4/2008 | Mayuzumi et al. | 361/760 |
| 7,515,421 | B2 * | 4/2009 | Apfelbacher et al. | 361/709 |

* cited by examiner

*Primary Examiner*—Boris L Chervinsky (57) ABSTRACT

A module assembly includes a component housing having a plurality of walls forming a cavity. At least one of the walls includes an opening therethrough open to the cavity. The heat transfer plate is mounted within the opening of the component housing and his exposed on an exterior of the component housing. The heat transfer plate forms at least a portion of a mounting surface of the component housing.

24 Claims, 6 Drawing Sheets

MODULE ASSEMBLY HAVING HEAT TRANSFER PLATE

CROSS REFERENCE TO RELATED APPLICATIONS

This application claims the benefit of U.S. Provisional Application No. 60/999,997 filed Oct. 23, 2007 and titled "MODULE ASSEMBLY", the subject matter of which is herein incorporated by reference in its entirety.

BACKGROUND OF THE INVENTION

The subject matter herein relates generally to electrical modules, and more particularly, to a module assembly with an improved heat transfer plate.

Electrical devices and/or modules are used in many applications to control or regulate circuits with electrical components. A variety of electrical components may be mounted or installed within the module assembly. For example, many modules include a printed circuit board (PCB) having numerous electrical components, such as a MOSFET, diodes, capacitors, resistors, transistors, microprocessors and other types of components, attached thereto. Electrical contacts are attached to the PCB and/or the electrical components and lead to an attached connector that carry signals and power to or from contacts in a mating connector.

The module assembly provides an environmentally secure and often times compact assembly to protect the electrical components and electrical contacts. The module assembly may then be installed in a particular mounting location to provide a particular electrical function. However, when in operation, the electrical components generate heat. Consequently, heat dissipating or cooling systems are often required as part of the module assembly to prevent overheating and to keep the module assembly operating as intended.

In typical applications, an aluminum heatsink is used to dissipate the heat generated by the electrical components. The heatsinks are typically expensive and occupy a large space, increasing the overall size of the module assembly. For example, the heatsinks have a plurality of upstanding fins that are exposed to air and cooled by convection cooling, where the larger the surface area of the fins, the greater the heat dissipation. In some active cooling applications, a fan is used to blow air across the heatsink to increase the rate of power or heat dissipation. The problem is that these heat dissipation methods require expensive heatsinks or extra components that increase the size and cost of a module assembly.

A need remains for a module assembly that is cooled in a cost effective and reliable manner. A need remains for a module assembly that is compact in size with adequate heat dissipation.

BRIEF DESCRIPTION OF THE INVENTION

In one embodiment, a module assembly is provided that includes a component housing having a plurality of walls forming a cavity. At least one of the walls includes an opening therethrough open to the cavity. A heat transfer plate is mounted within the opening of the component housing and is exposed on an exterior of the component housing. The heat transfer plate forms at least a portion of a mounting surface of the component housing.

Optionally, the heat transfer plate may include an inner surface and an outer surface that is substantially parallel to the inner surface. The inner surface faces the cavity and the outer surface forms at least a portion of the mounting surface. The heat transfer plate may be a substantially solid metal block conducting heat from the cavity to the mounting surface. Optionally, the component housing may be configured to be mounted to a metal application mounting frame so that the heat transfer plate is in direct thermal engagement with the application mounting frame to conduct heat from the cavity to the application mounting frame by conductive of cooling. Optionally, the module assembly may include a bracket in direct thermal engagement with the application mounting frame, wherein the heat transfer plate is in direct thermal engagement with the bracket to conduct heat from the cavity to the bracket.

In another embodiment a module assembly is provided including a component housing having a plurality of walls forming a cavity, wherein at least one of the walls includes an opening therethrough open to the cavity. A circuit board and at least one heat generating component is received in the cavity and a heat transfer plate is mounted within the opening of the component housing. A thermally conductive medium is received the cavity and is positioned between the component and heat transfer plate. The thermally conductive medium transfers heat from the component to the heat transfer plate.

Optionally, the thermally conductive medium may be a thermal epoxy substantially filling the space between the heat transfer plate and the circuit board. The thermal epoxy may substantially fill the entire cavity. Optionally, the component housing may include a well wherein the heat transfer plate is positioned within the well, the component is aligned with the well, and the thermally conductive medium is received in the well between the heat transfer plate and the component. The component may be positioned on the circuit board between the circuit board and heat transfer plate. Optionally, the thermally conductive medium may be one of a thermal gel, a thermal pad, and a thermal tape that engages the heat transfer plate and the component and/or the circuit board. The thermally conductive medium may create a hermetic seal between the component housing and the heat transfer plate.

In a further embodiment, a module assembly for mounting to an application mounting frame is provided. The module assembly includes a component housing holding at least one heat generating component therein, and the component housing has a mounting wall being configured to face the application mounting frame. The module assembly also includes a heat transfer plate mounted to the mounting wall, wherein the heat transfer plate is positioned between the component and the mounting surface of the mounting wall so that the heat transfer plate is configured to conduct heat from the interior of the component housing to the application mounting frame by conduction cooling. Optionally, the heat transfer plate may directly engaged the application mounting frame.

DETAILED DESCRIPTION OF THE INVENTION

Figure 1:
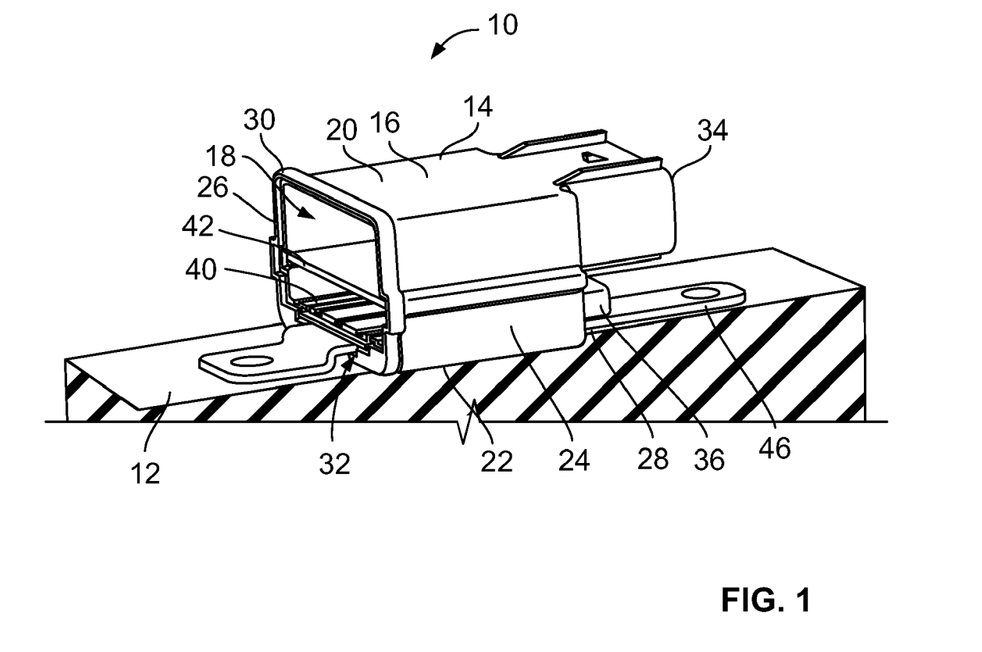
FIG. 1 is a perspective view of a module assembly formed in accordance with an exemplary embodiment.

FIG. 1 is a perspective view of a module assembly 10 formed in accordance with an exemplary embodiment. The module assembly 10 may be any type of electronic device or module. A variety of electrical components may be mounted or installed within the module assembly 10 that generate heat during operation. For example, the module assembly 10 may include electrical components such as a MOSFET, diodes, capacitors, resistors, transistors, microprocessors and other types of components. The module assembly 10 and the associated components form part of an electrical circuit in a device or system. One such application utilizing electrical circuits is an automotive application having an application assembly (e.g. an automobile). Other types of applications may utilize electrical circuits and module assemblies, and the subject matter herein is not intended to be limited to an automotive application. In an automotive application, the module assembly 10 may be any type of device or module within the electrical system of the automobile, such as a fuel pump module, a brake module, a clutch module, a cooling module, and the like.

The application assembly includes an application mounting frame 12. The application mounting frame 12 is a thermally conductive member, such as a metal frame member of the application assembly. In an automotive application, the application mounting frame 12 may be a thermally conductive member such as the chassis, firewall, fender well, or other metal frame member of the automobile. As described in further detail below, the application mounting frame 12 is utilized to dissipate heat from the module assembly 10. The application mounting frame 12 thus forms part the cooling circuit for the module assembly 10. The module assembly 10 uses conduction cooling to dissipate heat to the application mounting frame 12, which ultimately dissipates heat from the module assembly 10 by spreading the heat along the application mounting frame 12.

The module assembly 10 includes a component housing 14 having a plurality of walls 16 forming a cavity 18. In the illustrated embodiment, the component housing 14 is generally box shaped having a top wall 20 a bottom wall 22 and side walls 24, 26. The component housing. 14 includes a front end 28 and a rear end 30. The bottom wall 22 includes an opening 32 therethrough. The opening 32 extend substantially the length of the bottom wall 22. A connector housing 34 extends from the front end 28 of the component housing 14 proximate to the top wall 20. A mating housing 36 extends from the front end 28 of the component housing 14 proximate to the bottom wall 22. The component housing 14, the connector housing 34, and the mating housing 36 may be made from a durable, nonconductive material such as plastic. Other types of materials may be used in alternative embodiments.

The module assembly 10 includes a heat transfer plate 40 positioned within the opening 32 of the component housing 14. The heat transfer plate 40 may extend along the length of the component housing 14 and substantially cover the opening 32. The heat transfer plate 40 is exposed to the cavity 18 and is exposed to an exterior surface of the component housing 14.

The module assembly 10 includes a printed circuit board (PCB) 42 received within the cavity 18. The PCB 42 supports a least one heat generating component 124 (shown in FIG. 7). Heat generated by the components 124 is spread into the cavity 18 and/or the PCB 42 and ultimately drawn into the heat transfer plate 40 to cool the components 124.

In an exemplary embodiment, the module assembly 10 includes a bracket 46. The bracket 46 is used to mount the module assembly 10 to the application mounting frame 12. The bracket 46 engages the heat transfer plate 40 such that the bracket 46 and heat transfer plate 40 are in thermal communication with one another. As will be described in further detail below, heat is transferred from the heat transfer plate 40 to the bracket 46, and heat is transferred from the bracket 46 to the application mounting frame 12.

Figure 2:
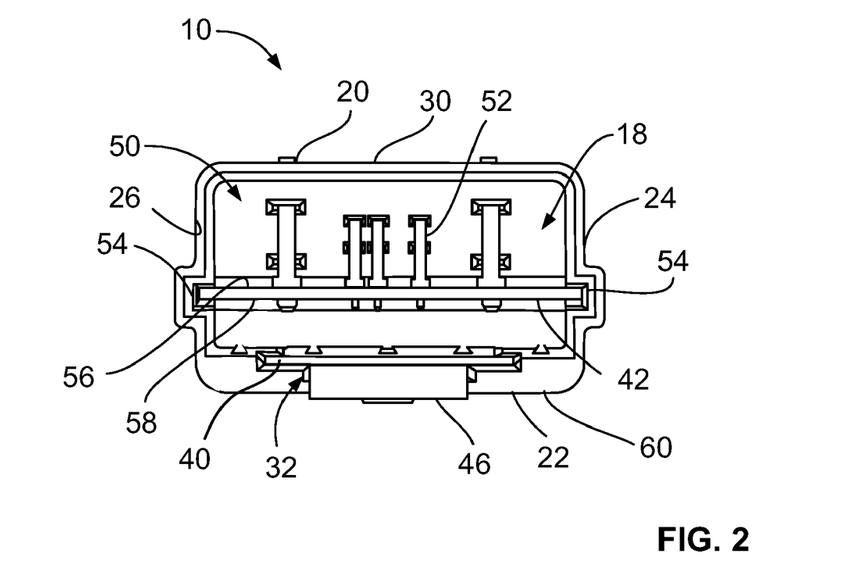
FIG. 2 is a rear view of the module assembly.

FIG. 2 is a rear view of the module assembly 10. The rear end 30 includes an opening 50 to the cavity 18. The PCB 42 is loaded into the cavity 18 through the opening 50 in the rear end 30. Contacts 52 extend from the PCB 42 through one of the walls 16 at the front end 28 of the component housing 14. The contacts 52 extend into the connector housing 34 (shown in FIG. 1).

In an exemplary embodiment, the component housing 14 includes grooves 54 formed in the side walls 24, 26. The grooves 54 extend along the length of the side walls 24, 26 and are located directly opposite each other. The grooves 54 receive side edges of the PCB 42 for aligning the PCB 42 within the cavity 18. The PCB 42 includes a first side 56 in a second side 58. The first side 56 faces the top wall 20 and the second side 58 faces the bottom wall 22. The component(s) 124 (shown in FIG. 7) may be mounted to the first side 56 and/or the second side 58. The PCB 42 may be positioned within the cavity 18 such that the PCB 42 is closer to either the top wall 20 or the bottom wall 22. Optionally, the PCB 42 may be elevated above the heat transfer plate 40 such that the PCB 42 is separated from heat transfer plate 40 by a gap. In an exemplary embodiment, the gap is filled with a material that encourages thermal transfer of heat from between the PCB 42 and/or the components 124 and the heat transfer plate 40.

The opening 32 in the bottom wall 22 receives the heat transfer plate 40. Optionally, the opening 32 may also receive at least a portion of the bracket 46. The opening 32 may define grooves along the sides thereof that hold the heat transfer plate 40 therein. The heat transfer plate 40 may be secured within the opening 32 by insert molding of the heat transfer plate 40 within the component housing 14. Alternatively, the heat transfer plate 40 may be slid into the opening 32, such as through the rear end 30 or through the bottom wall 22. The heat transfer plate 40 may then be secured within the opening 32, such as by a fastener, a friction fit, an adhesive, and the like. The bottom wall 22 of the component housing 14 constitutes a mounting surface 60 on an exterior thereof for interfacing with the application mounting frame 12. Optionally, the heat transfer plate 40 is exposed along the mounting surface 60 for direct engagement with the bracket 46, or alternatively with the application mounting frame 12 (shown in FIG. 1) or another thermally conductive member used for conducting heat away from the module assembly 10. The heat transfer plate 40 may form at least a portion of the mounting surface 60 when the module assembly is installed.

Figure 3:
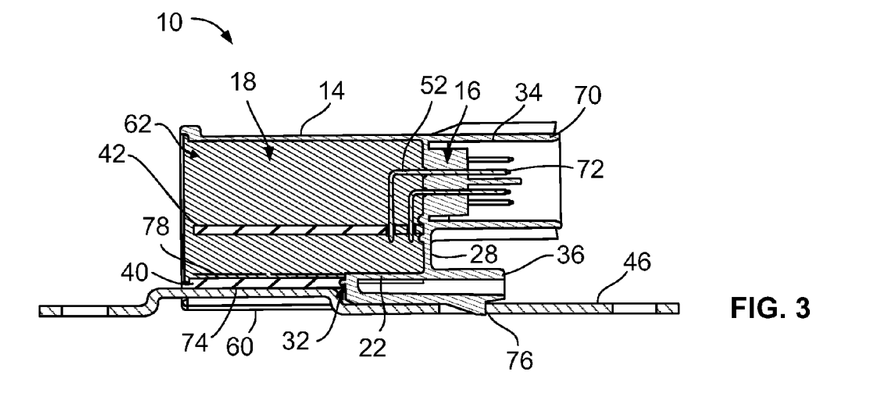
FIG. 3 is a side sectional view of the module assembly.

FIG. 3 is a side section view of the module assembly 10. FIG. 3 illustrates the component housing 14 mounted to the interface bracket 46. FIG. 3 also illustrates the PCB 42 loaded into the cavity 18 of the component housing 14. The contacts 52 extend from the PCB 42 through one of the walls 16 at the front end 28 into the connector housing 34. Optionally, the contacts 52 may be right angle contacts. The connector housing 34 is configured to receive a mating connector for mating with the contacts 52. The connector housing 34 includes a shroud 70 surrounding a mating end 72 of the contacts 52.

The heat transfer plate 40 is positioned in the opening 32. In an exemplary embodiment, the heat transfer plate 40 is a substantially solid block fabricated from a thermally conductive material, such as a metallic material like aluminum, copper, and the like. The heat transfer plate 40 includes an inner surface 78 and an outer surface 74. The inner surface 78 faces, and is exposed to, the cavity 18. The outer surface 74 faces outward and defines at least a portion of the mounting surface 60 of the module assembly 10. When using the interface bracket 46, the outer surface 74 engages the interface bracket 46 such that the heat transfer plate 40 and the interface bracket 46 are in thermal communication with one another. In an exemplary embodiment, the cavity 18 is at least partially filled with a thermally conductive medium 62. Optionally, the thermally conductive medium 62 may be a thermal epoxy, however other thermally conductive materials may be used in alternative embodiments. The thermally conductive medium 62 transfers heat from the PCB 42 and/or the heat generating component 124 to the heat transfer plate 40. In an exemplary embodiment, the inner surface 78 of the heat transfer plate 40 engages the thermally conductive medium 62. The thermally conductive medium 62 provides an interface for heat transfer between the cavity 18 and heat transfer plate 40.

The mounting housing 36 extends from the component housing 14 proximate to the bottom wall 22 and the front end 28. The mounting housing 36 may constitute an extension of the bottom wall 22 in a forward direction. The mounting housing 36 is used to mount the module assembly 10 to the interface bracket 46. The mounting housing 36 includes a mounting latch 76 extending downward therefrom. The mounting latch 76 may be generally wedge-shaped. Optionally, the mounting housing 36 may be flexible such that the mounting housing 36 can be deflected upward to remove the mounting latch 76 from the interface bracket 46, such as during the de-coupling of the mounting assembly 10 from the interface bracket 46.

Figure 4:
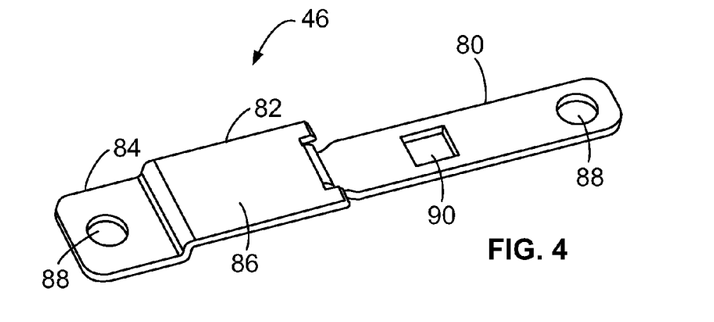
FIG. 4 is a perspective view of an interface bracket for the module assembly.

FIG. 4 is a perspective view of the interface bracket 46 for the module assembly 10 (shown in FIG. 1). The interface bracket 46 is generally a long, thin rectangular shape having a back portion 80, a middle portion 82, and a front portion 84. The interface bracket 46 is fabricated from a thermally conductive material, such as a metallic material, to provide good thermal conduction between the module assembly 10 and the application mounting frame 12. The middle portion 82 is generally positioned between the back portion 80 and the front portion 84, and may not be centered between the ends of the interface bracket 46. The middle portion 82 is generally planar and includes a thermal interface surface 86. When assembled, the middle portion 82 extends along the opening 32 such that the thermal interface surface 86 engages the heat transfer plate 40 (shown in FIG. 1). The thermal interface surface 86 has a complementary shape to the heat transfer plate 40 such that good thermal contact is made between heat transfer plate 40 and the interface bracket 46.

In an exemplary embodiment, the middle portion 82 is elevated above the back portion 80 and the front portion 84 such that the middle portion 82 is non-coplanar with the back and front portions 80, 84. Alternatively, the back, middle and front portions 80, 82, 84 may be substantially coplanar. The back and front portions 80, 84 may both include mounting holes 88 for mounting to the application mounting frame 12 (shown in FIG. 1). The front portion 84 includes a latch opening 90 that receives the mounting latch 76 (shown in FIG. 3) during assembly. The latch opening 90 may be rectangular, or alternatively may have any other shape for engaging the mounting latch 76.

Figure 5:
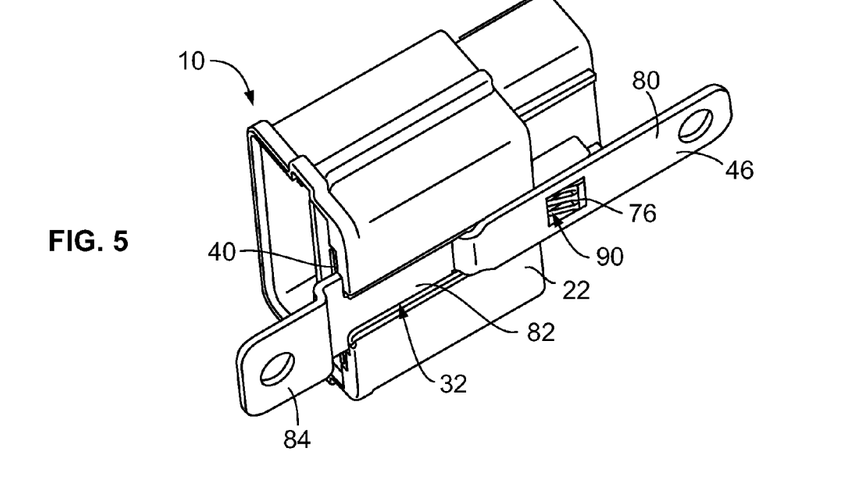
FIG. 5 is a bottom perspective view of the module assembly.

FIG. 5 is a bottom perspective view of the module assembly 10 mounted to the interface bracket 46. When assembled, the mounting latch 76 is received in latch opening 90 to secure the module assembly 10 to the interface bracket 46. Optionally, the bottom wall 22 may be generally aligned with the back and front portions 80, 84 of the interface bracket 46. The middle portion 82 may extend at least partially into the opening 32 to engage the heat transfer plate 40 which is positioned within the opening 32.

Figure 6:
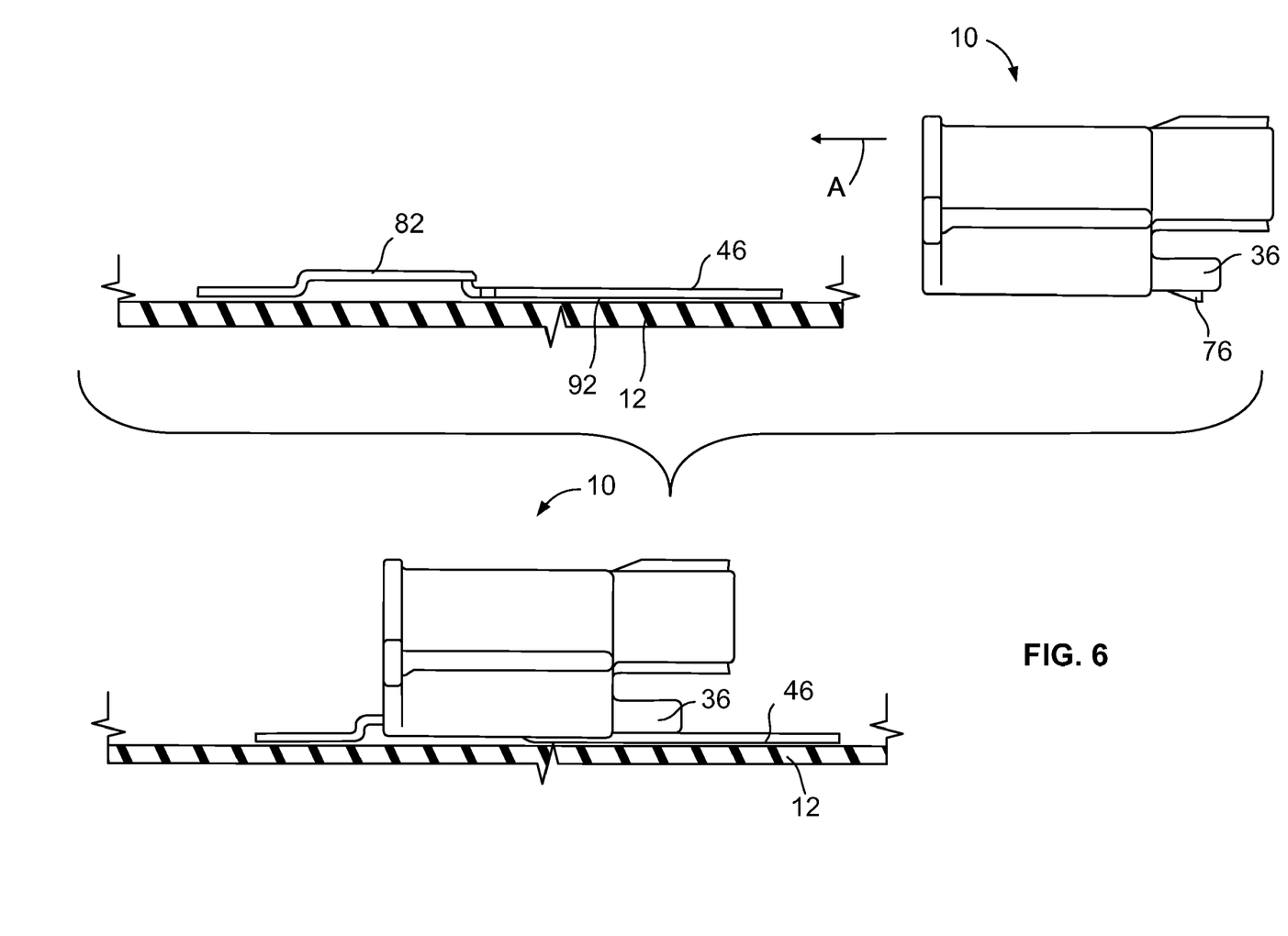
FIG. 6 is an exploded view showing the module assembly and mounting of the module assembly to the interface bracket.

FIG. 6 is an exploded view showing the module assembly 10 and mounting of the module assembly 10 to the interface bracket 46. The interface bracket 46 is securely mounted to the application mounting frame 12. A mounting surface 92 of the interface bracket 46 engages the application mounting frame 12 such that the interface bracket 46 is in thermal communication with the application mounting frame 12. Optionally, the interface bracket 46 may be welded to the application mounting frame 12. Alternatively, the interface bracket 46 may be secured to the application mounting frame 12 by another means, such as fasteners a thermal adhesive, and the like.

Once the interface bracket 46 is secured to the application mounting frame 12 the module assembly 10 may be coupled to the interface bracket 46. For example, the module assembly 10 may be slid onto the interface bracket 46 in a loading direction, such as the direction shown by arrow A. As the module assembly 10 is slid onto the interface bracket 46 the middle portion 82 of the interface bracket 46 is received in the opening 32 (shown in FIG. 1). The module assembly 10 is slid onto the interface bracket 46 until the mounting latch 76 is received in the latch opening 90 (shown in FIG. 4). The mounting latch 76 resists removal of the module assembly 10 from the interface bracket 46 until the mounting housing 36 is released. Alternatively, rather than first mounting the interface bracket 46 to the application mounting frame 12, the module assembly 10 may be initially coupled with the interface bracket 46 and then mounted to the application mounting frame 12 as a unit. Once assembled, the module assembly 10 is physically coupled to the application mounting frame 12 and heat is dissipated through the interface bracket 46 directly to the application mounting frame 12. The interface bracket 46 and the application mounting frame 12 thus act as part of the cooling circuit for the module assembly 10.

Figure 7:
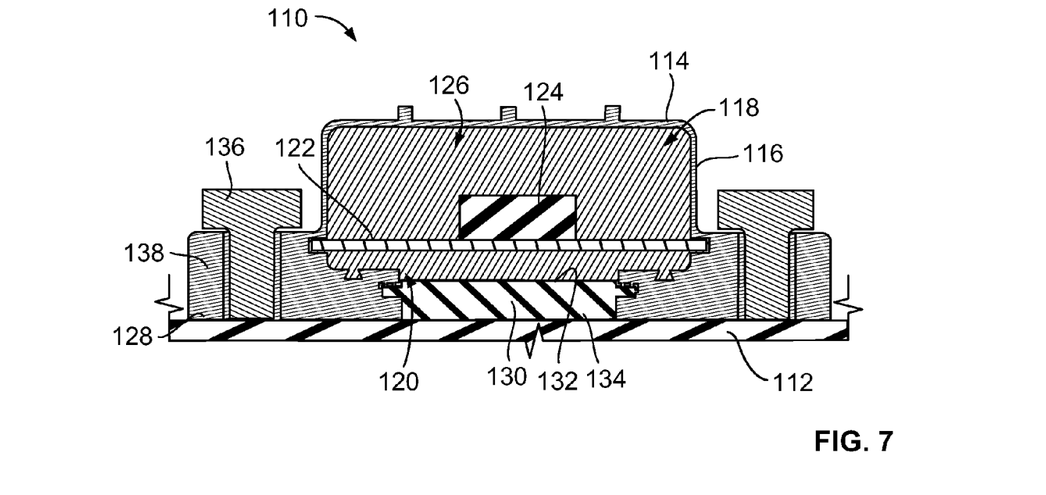
FIG. 7 through 12 are side sectional views of other embodiments of the module assembly.

FIG. 7 is an end sectional view of an alternative embodiment of a module assembly 110 mounted to an application mounting frame 112. The module assembly 110 may be similar to the module assembly 10 (shown in FIG. 1) in at least some respects, and some of the components and/or features of the module assembly 110 may be similar to, or identical to, the module assembly 10.

The module assembly 110 includes a component housing 114 having walls 116 defining a cavity 118. The component housing 114 includes an opening 120 through one of the walls 116. A PCB 122 is positioned within the cavity 118. The PCB 122 may have a plurality of heat generating components 124 mounted thereto and positioned within the cavity 118. The cavity 118 may be substantially filled with a thermally conductive medium 126, such as a thermal epoxy, that surrounds the PCB 122 and the heat generating components 124. An exterior of at least one of the walls 116 of the component housing 114 defines a mounting surface 128 that is mounted to the application mounting frame 112. Optionally, the component housing 114 may be mounted to the application mounting frame 112 without the use of an interface bracket. For example, the component housing 114 may include mounting flanges 138 formed integral therewith or attached thereto for mounting directly to the application mounting frame 112.

The module assembly 110 includes a heat transfer plate 130 positioned within the opening 120. The heat transfer plate 130 includes an inner surface 132 and an outer surface 134 facing the application mounting frame 112. The inner and outer surfaces 132, 134 may be generally parallel to one another. Optionally, the outer surface 134 may be substantially planar. In the illustrated embodiment, the module assembly 110 is mounted directly to the application mounting frame 112 so that the outer surface 134 directly engages the application mounting frame 112 to provide heat transfer through the application mounting frame 112. Optionally, fasteners 136 may be used to secure the component housing 114 directly to the application mounting frame 112, such as through the mounting brackets 138. Other mounting means may be used to secure the component housing 114 to the application mounting frame 112 in alternative embodiments.

In operation, heat generated by the components 124 is transferred by the thermally conductive medium 126 to the heat transfer plate 130. Optionally, the thermally conductive medium 126 engages the inner surface 132 of the heat transfer plate 130. The heat transfer plate 130 transfers the heat from the thermally conductive medium 126 to the application mounting frame 112. The application mounting frame 112 dissipates the heat from the heat transfer plate 130. The conductive cooling provided by the heat transfer plate 130 and the application mounting frame 112 effectively dissipates heat generated within the cavity 118. Optionally, because the thermally conductive medium 126 engages the walls 116 of the component housing 114, the component housing 114 aids in dissipating at least some of the heat generated within the cavity 118. Optionally, the component housing 114 may be fabricated from first material, such as a plastic material, having first thermal coefficient, and the heat transfer plate 130 may be fabricated from the second material, such as a metallic material, having a second thermal coefficient that is higher than the first thermal coefficient. The heat transfer plate 130 is a better thermal conductor than the component housing 114 however the component housing 114 may facilitate some heat dissipation. Optionally, a thermal interposer may be positioned between the heat transfer plate 130 and the application mounting frame 112. For example, a thermal tape, a thermal gel, a thermal pad, a thermal epoxy, or a metallic member may be positioned between the heat transfer plate 130 and the application mounting frame 112 to transfer heat therebetween.

Figure 8:
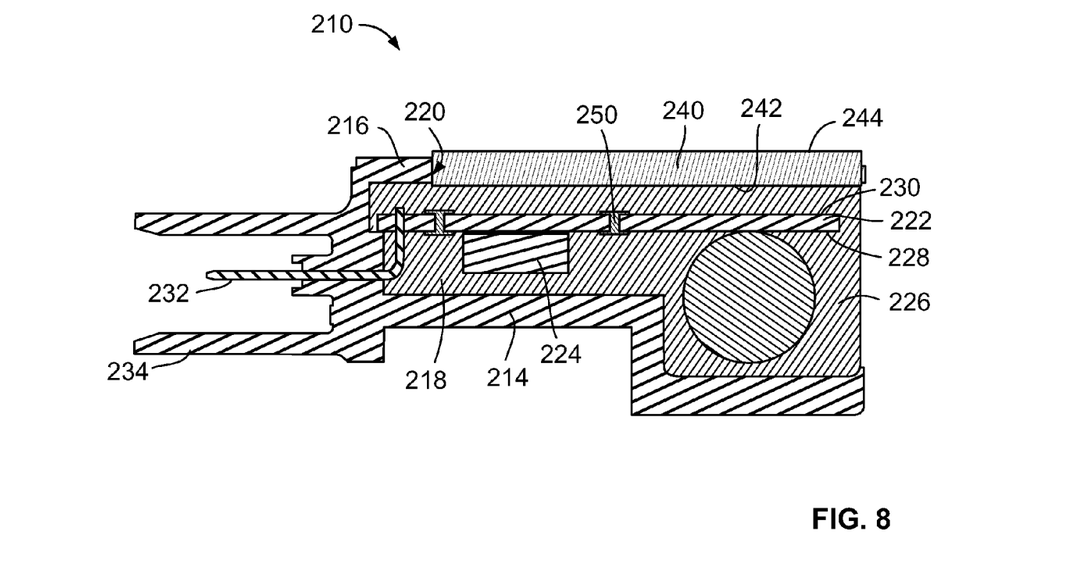

FIG. 8 is a side sectional view of an alternative embodiment of a module assembly 210. The module assembly 210 includes a component housing 214 having walls 216 defining a cavity 218. The component housing 214 includes an opening 220 through one of the walls 216. A PCB 222 is positioned within the cavity 218. The PCB 222 may have a plurality of heat generating components 224 mounted thereto that are positioned within the cavity 218. For example, the components 224 may include a MOSFET and a fly back diode. Other types of components 224 may additionally or alternatively be used. A thermally conductive medium 226 is received within the cavity 218. The PCB 222 includes a first side 228 and a second side 230. The PCB 222 also includes contacts 232 that extend through the component housing 214 into a mating housing 234.

The module assembly 210 includes a heat transfer plate 240 mounted within the opening 220. In the illustrated embodiment, the heat transfer plate 240 is shown mounted to a top of the module assembly 210, however, it is realized that the heat transfer plate 240 and corresponding opening 220 may be differently positioned in alternative embodiments, such as on the bottom, one of the sides, one of the ends, or a combination thereof. The module assembly 210 is mounted to the application mounting frame 12 (shown in FIG. 1) such that the heat transfer plate 240 generally faces the application mounting frame 12. As such, the module assembly 210 may be mounted to a top, a bottom or a side of the application mounting frame 12 depending on the particular application. The heat transfer plate 240 includes an inner surface 242 and an outer surface 244 that faces an application mounting frame. The inner and outer surfaces 242, 244 may be generally parallel to one another. Optionally, the outer surface 244 may be substantially planar. Optionally, the module assembly 210 may be mounted directly to the application mounting frame so that the outer surface 244 directly engages the application mounting frame. Alternatively, a thermal interposer may be positioned between the heat transfer plate 240 and the application mounting frame.

When assembled, the components 224 are mounted oil the first side 228 of the PCB 222. The PCB 222 is loaded into the cavity 218 such that the second side 230 faces the heat transfer plate 240 and the components 224 face away from the heat transfer plate 240. The thermally conductive medium 226 engages the inner surface 242 at an interface. The thermally conductive medium 226 substantially fills the cavity 218. Optionally, the thermally conductive medium 226 creates a thermal path between the components 224 and the heat transfer plate 240. The thermally conductive medium 226 substantially surrounds and engages the components 224 to draw the generated heat away from the components 224. Optionally, the thermally conductive medium 226 may be selectively located within the cavity 218, such as proximate to the components 224. The PCB 222 may conduct heat therethrough from the first side 228, where most of the heat is generated, to the second side 230 where the heat transfer plate 240 is located. Optionally, thermal vias 250 may be provided through the PCB 222. The thermal vias 250 may be fabricated from a conductive material, such as a metallic material, extending between the first and second sides 228, 230. The thermal vias 250 may have enlarged thermal pads on the first and second sides 228, 230 that engage the thermally conductive medium 226 for efficient heat transfer. Optionally, traces on the first and second sides 228, 230 may constitute the thermal vias 250 and/or the thermal pads. Optionally, the thermal vias 250 may be openings through the PCB 222 wherein the thermally conductive medium 226 fills the openings to conduct heat therethrough.

Figure 9:
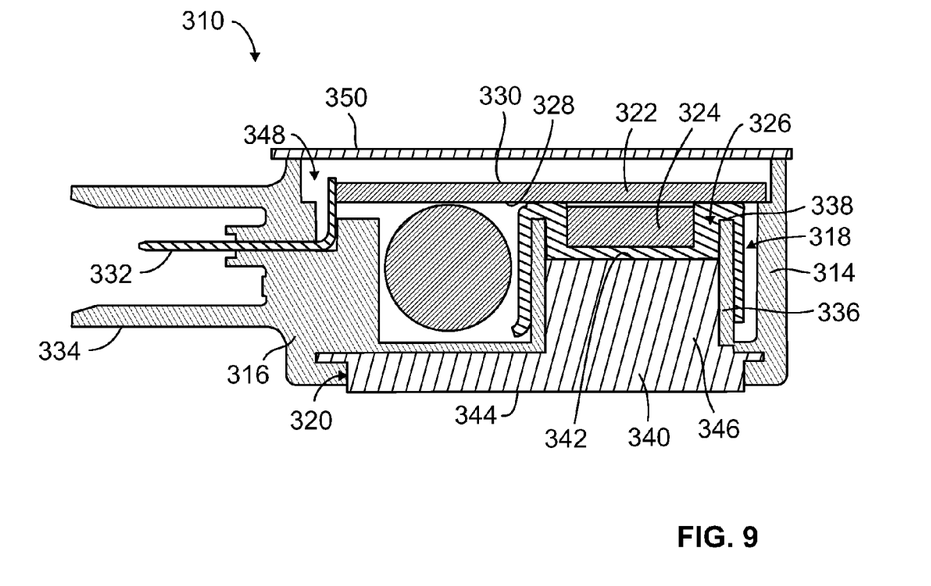

FIG. 9 is a side sectional view of an alternative embodiment of a module assembly 310. The module assembly 310 includes a component housing 314 having walls 316 defining a cavity 318. The component housing 314 includes an opening 320 through one of the walls 316. A PCB 322 is positioned within the cavity 318. The PCB 322 may have a plurality of heat generating components 324 mounted thereto that are positioned within the cavity 318. A thermally conductive medium 326 is received within the cavity 318. The PCB 322 includes a first side 328 and a second side 330. The components 324 are mounted on the first side 328 of the PCB 322. The PCB 322 also includes contacts 332 that extend through the component housing 314 into a mating housing 334. The component housing 314 includes a well 336 associated with the opening 320. The well 336 has a distal end 338 away from the opening 320.

The module assembly 310 includes a heat transfer plate 340 mounted within the opening 320. At least a portion of the heat transfer plate 340 extends into the well 336. The heat transfer plate 340 includes an inner surface 342 and an outer surface 344 that faces an application mounting frame. In the illustrated embodiment, the heat transfer plate 340 includes an elevated portion 346 that extends into the well 336. The end of the elevated portion 346 constitutes the inner surface 342. Optionally, the end of the elevated portion 346 may be recessed below the distal end 338 of the well 336. The inner and outer surfaces 342, 344 may be generally parallel to one another. The outer surface 344 may be substantially planar. Optionally, the module assembly 310 may be mounted directly to an application mounting frame so that the outer surface 344 directly engages the application mounting frame. Alternatively, a thermal interposer (not shown) may be positioned between the heat transfer plate 340 and the application mounting frame. The thermal interposer may be any thermally conductive element or material bridging the gap between the heat transfer plate 340 and the application mounting frame.

When assembled, the components 324 are mounted on the first side 328 of the PCB 322. The PCB 322 is loaded into the cavity 318 such that the first side 328 laces the heat transfer plate 340. As such, the components 324 face the heat transfer plate 340. At least one of the components 324 is aligned with the well 336. Optionally, at least one of the components 324 may be at least partially received within the well 336. The thermally conductive medium 326 may be selectively positioned within the cavity 318, such as in the vicinity of the well 336. The thermally conductive medium 326 bridges the gap between the component 324 and heat transfer plate 340. At least a portion of the cavity 318 may be filled with air or another medium other than the thermally conductive medium 326. Alternatively, the cavity 318 may be substantially filled with the thermally conductive medium 326. The thermally conductive medium 326 engages the component 324 and the inner surface 342. Optionally, the amount of thermally conductive medium 326 may be limited to engaging less than all of the components 324. In an exemplary embodiment, the heat transfer plate 340 is coupled to the component housing 314 such that the elevated portion 346 is received in the well 336. The thermally conductive medium 326 is positioned in the well 336. Optionally, the thermally conductive medium 326 may fill the well 336 to the distal end 338. The PCB 322 and the components 324 are then loaded into the cavity 318 through an open top 348. The component(s) 324 may be positioned in close proximity to the heat transfer plate 340. The thermally conductive medium 326 creates a thermal path between the component 324 and the heat transfer plate 340. When the component 324 is loaded into the well 336 at least some of the thermally conductive medium 326 may be displaced by the component 324. Some of the thermally conductive medium 326 may spill out of the well 336. A cover 350 covers the open top 348 to seal the cavity 318.

Figure 10:
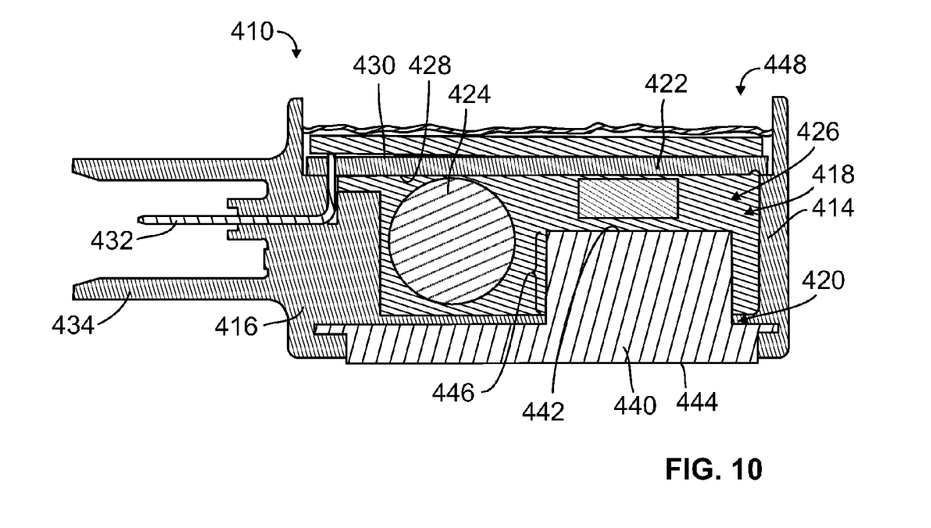

FIG. 10 is a side sectional view of an alternative embodiment of a module assembly 410. The module assembly 410 includes a component housing 414 having walls 416 defining a cavity 418. The component housing 414 includes an opening 420 through one of the walls 416. A PCB 422 is positioned within the cavity 418. The PCB 422 may have a plurality of heat generating components 424 mounted thereto that are positioned within the cavity 418. A thermally conductive medium 426 is received within the cavity 418. The PCB 422 includes a first side 428 and a second side 430. The components 424 are mounted on the first side 428 of the PCB 422. The PCB 422 also includes contacts 432 that extend through the component housing 414 into a mating housing 434.

The module assembly 410 includes a heat transfer plate 440 mounted within the opening 420. The heat transfer plate 440 includes an inner surface 442 and an outer surface 444 that faces an application mounting frame. In the illustrated embodiment the heat transfer plate 440 includes an elevated portion 446 that extends into the cavity 418. The end of the elevated portion 446 constitutes the inner surface 442. The inner and outer surfaces 442, 444 may be generally parallel to one another. Optionally, the outer surface 444 may be substantially planar. The module assembly 410 may be mounted directly to the application mounting frame so that the outer surface 444 directly engages the application mounting frame. Alternatively, a thermal interposer (not shown) may be positioned between the heat transfer plate 440 and the application mounting frame.

When assembled, the components 424 are mounted on the first side 428 of the PCB 422. The PCB 422 is loaded into the cavity 418 such that the first side 428 faces the heat transfer plate 440. As such, the components 424 face the heat transfer plate 440. At least one of the components 424 is aligned with the elevated portion 446 and is separated therefrom by a gap. Optionally, the cavity 418 may be substantially filled with the thermally conductive medium 426. Alternatively, the thermally conductive medium 426 may be selectively positioned within the cavity 418, such as in the vicinity of the component 424 and the elevated portion 446, such as to reduce the amount of thermally conductive medium 426 used. The thermally conductive medium 426 bridges the gap between the component 424 and the heat transfer plate 440. The thermally conductive medium 426 engages the component 424 and the inner surface 442. Optionally, the heat transfer plate 440 is mated with the component housing 414, such as by insert molding or by sliding the heat transfer plate 440 into the opening 420. The cavity 418 is then filled with the thermally conductive medium 426. The PCB 422 and the components 424 are then loaded into the cavity 418 through an open top 448. When loaded, the component(s) 424 may be positioned in close proximity to the heat transfer plate 440. Optionally, additional thermally conductive medium 426 may fill the cavity 418 behind the PCB 422 after the PCB 422 is loaded into the cavity 418. Alternatively, a different type of material may be used to fill the cavity 418, such as a sealant or a potting material. In other alternative embodiments, a cover may cover the open top 448 to seal the cavity 418. The thermally conductive medium 426 creates a thermal path between the component 424 and the heat transfer plate 440.

Figure 11:
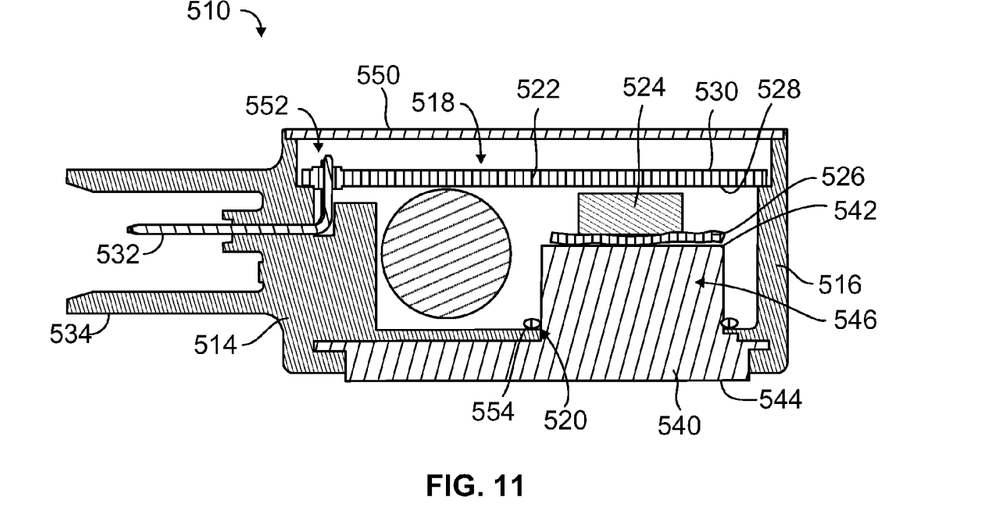

FIG. 11 is a side sectional view of an alternative embodiment of a module assembly 510. The module assembly 510 is similar to module assembly 410 shown in FIG. 10, however the module assembly 510 does not utilize a thermal epoxy within a cavity 518. The module assembly 510 includes a component housing 514 having walls 516 defining the cavity 518. The component housing 514 includes an opening 520 through one of the walls 516. A PCB 522 is positioned within the cavity 518. The PCB 522 may have a plurality of heat generating components 524 mounted thereto that are positioned within the cavity 518. A thermally conductive medium 526 is received within the cavity 518. In the illustrated embodiment, the thermally conductive medium 526 constitutes a thermal gel positioned between the component 524 and the heat transfer plate 540. The thermally conductive medium 526 may be a different type of thermally conductive medium an alternative embodiments such as a thermal pad, a thermal tape, and the like. The PCB 522 includes a first side 528 and the second side 530. The components 524 are mounted on the first side 528 of the PCB 522. The PCB 522 also includes contacts 532 that extend through the component housing 514 into a mating housing 534.

The module assembly 510 includes the heat transfer plate 540 mounted within the opening 520. The heat transfer plate 540 includes an inner surface 542 and an outer surface 544 that faces the application mounting frame. In the illustrated embodiment, the heat transfer plate 540 includes an elevated portion 546 that extends into the cavity 518. The end of the elevated portion 546 constitutes the inner surface 542. The inner and outer surfaces 542, 544 may be generally parallel to one another. Optionally, the outer surface 544 may be substantially planar. Optionally, the module assembly 510 may be mounted directly to the application mounting frame so that the outer surface 544 directly engages the application mounting frame. Alternatively, a thermal interposer (not shown) may be positioned between the heat transfer plate 540 and the application mounting frame.

When assembled, the components 524 are mounted on the first side 528 of the PCB 522. The PCB 522 is loaded in the cavity 518 such that the first side 528 faces the heat transfer plate 540. As such, the components 524 face the heat transfer plate 540. At least one of the components 524 is aligned with the elevated portion 546 and is separated therefrom by a gap. The thermally conductive medium 526 spans the gap to engage both the heat transfer plate 540 and the component 524 such that the heat transfer plate 540 and the components 524 are in thermal communication with one another. Optionally, the thermally conductive medium 526 may be applied to more surfaces of the heat transfer plate 540, the component(s) 524 and/or the PCB 522. The thermally conductive medium 526 may be applied to either the heat transfer plate 540 or the component 524 prior to assembly. The thermally conductive medium 526 creates a thermal path between the component 524 and the heat transfer plate 540.

A cover 550 covers an open top 552 of the cavity 518 to seal the cavity 518 after the PCB 522 is loaded into the cavity 518. Optionally, a seal 554 may be provided between the heat transfer plate 540 and the component housing 514 to seal the opening 520.

Figure 12:
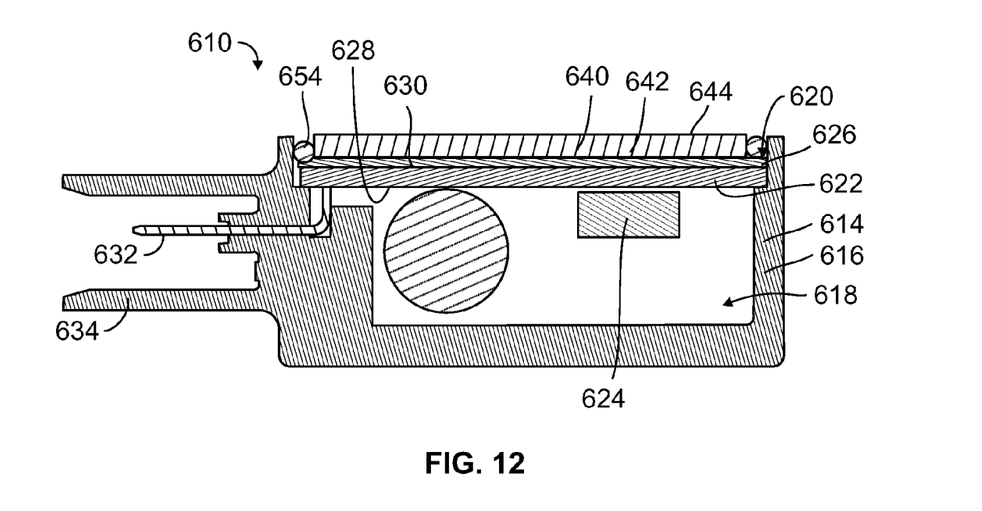

FIG. 12 is a side sectional view of an alternative embodiment of a module assembly 610. The module assembly 610 is similar to module assembly 210 shown in FIG. 8, however the module assembly 610 does not utilize a thermal epoxy within a cavity 618.

The module assembly 610 includes a component housing 614 having walls 616 defining the cavity 618. The component housing 614 includes an opening 620 through one of the walls 616. A PCB 622 is positioned within the cavity 618. The PCB 622 may have a plurality of heat generating components 624 mounted thereto that are positioned within the cavity 618.

A thermally conductive medium 626 is received within the cavity 618. In the illustrated embodiment the thermally conductive medium 626 constitutes a thermal tape positioned between the PCB 622 and the heat transfer plate 640. The thermally conductive medium 626 may be a different type of thermally conductive medium an alternative embodiments such as a thermal pad, a thermal gel, and the like. Optionally, more than one type of thermally conductive medium 626 may be utilized, such as a layered structure with, for example, a thermal tape applied to the heat transfer plate 640 and a thermal epoxy between the PCB 622 and a thermal tape. Other combinations are possible another alternative embodiments.

The PCB 622 includes a first side 628 and a second side 630. The components 624 are mounted on the first side 628 of the PCB 622. The PCB 622 also includes contacts 632 that extend through the component housing 614 into a mating housing 634.

The module assembly 610 includes the heat transfer plate 640 mounted within the opening 620. The heat transfer plate 640 includes an inner surface 642 and an outer surface 644 that faces an application mounting frame. The inner and outer surfaces 642, 644 may be generally parallel to one another. Optionally, the outer surface 644 may be substantially planar. The module assembly 610 may be mounted directly to the application mounting frame so that the outer surface 644 directly engages the application mounting frame. Alternatively, a thermal interposer (not shown) may be positioned between the heat transfer plate 640 and the application mounting frame.

When assembled, the components 624 are mounted on the first side 628 of the PCB 622. The PCB 622 is loaded in the cavity 618 such that the first side 628 faces away from the heat transfer plate 640. The thermally conductive medium 626 is positioned between the PCB 622 and the heat transfer plate 640. Optionally, the thermally conductive medium 626 may entirely fill the gap between the heat transfer plate 640 and the PCB 622, wherein the thermally conductive medium 626 engages the second side 630 of the PCB 622 and the inner surface 642 of the heat transfer plate 640 such that the heat transfer plate 640 and the PCB 622 are in thermal communication with one another. Heat generated by the components 624 may be transferred through the PCB 622, such as by thermal vias or by the substrate of the PCB 622 itself. Optionally, additional thermally conductive medium 626 may wholly or partly fill the cavity 618 around the components 624. Optionally, a seal 654 may be provided between the heat transfer plate 640 and the component housing 614 to seal the opening 620. The seal 644 may be a thermal epoxy or another type of sealant.

A module assembly is less provided in the may be manufactured in a cost-effective and reliable manner. The module assembly has a cooling circuit that effectively dissipates heat from the module assembly by conductive cooling. The module assembly houses a plurality of heat generating components on a PCB within the cavity of the component housing. The heat transfer plate is held by the component housing and thermal vindication with the cavity and with an exterior of the component housing. The heat transfer plate includes an inner surface and an outer surface and his thermally conductive. In an exemplary embodiment, a thermally conductive medium is provided within the housing and transfers heat from the components to the heat transfer plate. For example, a thermal epoxy or another thermally conductive element directly connects the heat transfer plate to the PCB and/or the components to effectively dissipate heat from the PCB and/or the components to the heat transfer plate. The cooling circuit utilizes the application mounting frame to spread the heat generated by the module assembly. For example, the heat transfer plate may be in direct contact with an application mounting frame to dissipate heat directly to the application mounting frame. Alternatively, a thermal interposer may be positioned between the heat transfer plate and the application mounting frame to spread the heat from the heat transfer plate to the application mounting frame. Optionally, an interface bracket that is used amount module assembly to the application mounting frame may constitute the thermal interposer. The use of the application mounting frame to dissipate heat replaces the need for heat sink to dissipate the heat and reduces the overall cost of the module assembly.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A module assembly comprising:
   a component housing having a plurality of walls forming a cavity, wherein at least one of the walls includes an opening therethrough open to the cavity; and
   a heat transfer plate positioned within the opening of the component housing and being exposed on an exterior of the component housing, wherein the heat transfer plate includes a mounting surface configured to be mounted to a metal application mounting frame, the heat transfer plate defining a thermal path between the cavity and the metal application mounting frame to dissipate heat from the cavity to the metal application mounting frame.

2. The module assembly of claim 1, wherein the heat transfer plate includes an inner surface and an outer surface substantially parallel to the inner surface, the inner surface faces the cavity and the outer surface forms at least a portion of the mounting surface, a majority of the outer surface being configured to engage the metal application mounting frame.

3. The module assembly of claim 1, wherein the heat transfer plate is a substantially solid metal block conducting heat from the cavity to the mounting surface, a majority of the mounting surface being configured to engage the metal application mounting frame.

4. The module assembly of claim 1, wherein a majority of the heat transfer plate is in direct thermal engagement with the application mounting frame to conduct heat from the cavity to the application mounting frame.

5. The module assembly of claim 1, wherein the module assembly further comprises a bracket being in direct thermal engagement with the application mounting frame, the heat transfer plate being in direct thermal engagement with the bracket to conduct heat from the cavity to the bracket.

6. The module assembly of claim 1, wherein the heat transfer plate is insert molded into the component housing.

7. The module assembly of claim 1, wherein the component housing includes a mounting wall, the mounting wall includes the opening and the heat transfer plate extends at least partially into the opening.

8. The module assembly of claim 1, wherein a thermally conductive medium is received in the cavity, the thermally conductive medium engaging the heat transfer plate to transfer heat to the heat transfer plate.

9. The module assembly of claim 1, wherein the metal application mounting frame constitutes a heat sink being configured to dissipate a large amount of heat, the heat transfer plate being separate and distinct from the metal application mounting frame and being configured to be mounted thereto, wherein heat generated in the cavity is dissipated to the metal application mounting frame via the heat transfer plate.

10. The module assembly of claim 1, wherein the heat transfer plate is planar and includes an inner surface and an outer surface generally parallel to the inner surface, the inner surface defining an inner-most portion of the heat transfer plate, the outer surface defining an outer-most portion of the heat transfer plate.

11. The module assembly of claim 1, wherein the heat transfer plate is devoid of heat dissipating fins.

12. The module assembly of claim 1, further comprising a bracket having mounting features configured for mounting the bracket to the metal application mounting frame, the component housing and the heat transfer plate being mounted to the bracket such that the heat transfer plate is in direct thermal engagement with the bracket, the bracket being in direct thermal engagement with the metal application mounting frame when mounted thereto to conduct heat from the heat transfer plate to the metal application mounting frame.

13. A module assembly comprising:
   a component housing having a plurality of walls forming a cavity, wherein at least one of the walls includes an opening therethrough open to the cavity;
   a circuit board having at least one heat generating component, the circuit board being received in the cavity;
   a heat transfer plate mounted within the opening of the component housing, the heat transfer plate being configured to be mounted to a metal application mounting frame, the heat transfer plate defining a thermal path between the cavity and the metal application mounting frame to dissipate heat from the cavity to the metal application mounting frame; and
   a thermally conductive medium received in the cavity and being positioned between the component and the heat transfer plate, the thermally conductive medium transferring heat from the component to the heat transfer plate.

14. The module assembly of claim 13, wherein the thermally conductive medium is a thermal epoxy substantially filling the space between the heat transfer plate and the circuit board.

15. The module assembly of claim 13, wherein the thermally conductive medium is a thermal epoxy substantially filling the cavity.

16. The module assembly of claim 13, wherein the component housing includes a well, the heat transfer plate being positioned within the well, the component being aligned with the well, the thermally conductive medium received in the well between the heat transfer plate and the component.

17. The module assembly of claim 13, wherein the component is positioned on the circuit board between the circuit board and heat transfer plate.

18. The module assembly of claim 13, wherein at least a portion of the cavity is filled with air.

19. The module assembly of claim 13, wherein the thermally conductive medium is one of a thermal gel, a thermal pad, and a thermal tape engaging the heat transfer plate and at least one of the component and the circuit board.

20. The module assembly of claim 13, wherein the thermally conductive medium creates a hermetic seal between the component housing and the heat transfer plate.

21. The module assembly of claim 13, wherein the circuit board includes first and second sides, the second side faces the heat transfer plate and the first side faces away from heat transfer plate, the component is positioned on the first side of the circuit board, and the circuit board includes at least one thermal via therethrough conducting heat between the first and second sides.

22. The module assembly of claim 13, wherein the component housing is fabricated from a first material having a first thermal coefficient, and the heat transfer plate is fabricated from a second material having a second thermal coefficient that is higher than the first thermal coefficient.

23. A module assembly for mounting to an application mounting frame, the module assembly comprising:
- a component housing holding at least one heat generating component therein, the component housing having a mounting wall being configured to face the application mounting frame; and
- a heat transfer plate mounted to the mounting wall, wherein the heat transfer plate is positioned between the component and the mounting wall so that the heat transfer plate is configured to conduct heat from the interior of the component housing to the application mounting frame by conduction cooling.

24. The module assembly of claim 23, wherein the heat transfer plate is configured to directly engage the application mounting frame to define a primary heat transfer path from the interior of the component housing to the application mounting frame.

* * * * *